United States Patent

Trinkl

[11] 4,359,647
[45] Nov. 16, 1982

[54] MASTER-SLAVE FLIP-FLOP ARRANGEMENT

[75] Inventor: Wolfgang Trinkl, Dachau-Mitterndorf, Fed. Rep. of Germany

[73] Assignee: Siemens Aktiengesellschaft, Berlin & Munich, Fed. Rep. of Germany

[21] Appl. No.: 31,310

[22] Filed: Apr. 18, 1979

[30] Foreign Application Priority Data

May 16, 1978 [DE] Fed. Rep. of Germany ....... 2821231

[51] Int. Cl.³ .............................................. H03K 5/00
[52] U.S. Cl. ............................ 307/238.1; 307/272 A; 307/291; 307/299 A
[58] Field of Search .................. 307/291, 238.1, 238.9, 307/221, 452, 453, 467, 480, 481, 455, 272 A, 299 A

[56] References Cited

U.S. PATENT DOCUMENTS

| | | | |
|---|---|---|---|
| 3,440,449 | 4/1969 | Priel et al. | 307/291 |
| 3,585,410 | 6/1971 | Burtness | 307/291 |
| 3,603,819 | 9/1971 | Nijmegen | 307/291 |
| 3,603,819 | 9/1971 | Molle | 307/291 |
| 3,621,289 | 11/1971 | Sasaki | 307/291 |
| 3,818,251 | 6/1974 | Hoehn | 307/221 R |
| 3,912,950 | 10/1975 | Tada | 307/291 |
| 4,145,623 | 3/1979 | Doucette | 307/291 |
| 4,193,007 | 3/1980 | Tietz | 307/291 |
| 4,197,470 | 4/1980 | Banzhaf | 307/291 |
| 4,276,488 | 6/1981 | Benedict et al. | 307/455 |
| 4,289,979 | 9/1981 | Muller | 307/291 |

Primary Examiner—Saxfield Chatmon, Jr.
Attorney, Agent, or Firm—Hill, Van Santen, Steadman, Chiara & Simpson

[57] ABSTRACT

A plurality of master-slave flip-flops, constructed in current-switching technology, are considered. The displacement of switching thresholds of the master flip-flop and the slave flip-flop, required for fault-free operation, is achieved by differing emitter current densities as a result of a parallel connection of transistors. Circuits constructed in accordance with the present invention are particularly adaptable to large scale integration which requires neither special embodiments of transistors nor reference potentials which deviate from standard reference potentials.

20 Claims, 6 Drawing Figures

MASTER-SLAVE FLIP-FLOP ARRANGEMENT

BACKGROUND OF THE INVENTION

1. Field of the Invention

The present invention relates to a master-slave flip-flop arrangement, particularly a clock-controlled arrangement which may be employed in large scale integration modules with standard, diffused basic structures, in which, in addition to resistors, contains a supply of transistors having identical emitters, a master flip-flop and a slave flip-flop each constructed of series-coupled current switches with emitter-coupled transistors, in which, in each storage element, there is provided in the collector circuits of the transistors of a lower current switch which is controlled by a clock, a respective further upper current switch for receiving and inputing data, and in which the first and second storage elements are oppositely circuited and provided with mutual displacement of the switching thresholds through the provision of parallel-connected transistors or, a plurality of transistors functioning as diodes.

2. Description of the Prior Art

A master-slave flip-flop has two storage elements of which one is respectively in the storing state while the other is switched to a data receiving state. A common clock input is provided for both storage elements. Upon the occurrence of a clock pulse, the first storage element stores the information pending at the data input and the second storage element is blocked. A change of the information during a clock pulse causes the new information to be stored in the first storage element. At the end of the clock pulse, the first storage element is blocked with respect to further information input and the second storage element receives the information last stored in the first storage element.

The correct switching operation of a master-slave flip-flop is guaranteed when the switching process, triggered by means of the clock pulse, sequences somewhat later in that storage element which is to receive information than in the storage element which is to store the information. The time difference must be sufficiently large that the acceptance of the information previously stored by the first storage element into the second storage element is terminated before a new information arrives at the first storage element. Since the clock pulses always have more or less straight leading and trailing edges, the necessary time differences can be achieved by a mutual displacement of the switching thresholds of the switching elements in the two storage elements which are directly controlled by the clock. In the following, only master-slave flip-flops are considered which are designed in current-switching technology, also known as emitter-coupled logic (ECL or $E^2CL$) technology. In known circuits of this type, use is made of series coupling in both storage elements (cf. Data Sheet MC 10131, Motorola Inc., 3rd Edition, September 1973, p. 3/85, fully incorporated herein by this reference). In the known circuit arrangement, the different switching thresholds are generated by a displacement of the reference voltage for the lower current switch of a storage element, directly controlled by the clock, by a small amount with respect to a standard value. Making reference voltages available which deviate from internal module standard values, however, requires special components. Such special components, however, are not generally available in highly integrated modules, in which one proceeds from a constant supply of modules for the formation of different circuit complexes, for reasons of rational production. At least in the inner area of such modules, subdivided into cells having identical basic structures, and reserved for the formation of logic circuits and the appertaining reference voltage sources (bias drivers), the transistors of the component supply have identical emitter surfaces. At most, the transistors differ by the number of emitters. The supply of ohmic resistors is likewise limited to a few specific values which are adapted to the intended circuit technology and, in conjunction with the transistor supply, permit realization of all essential linkage functions with a high degree of exploitation of the available components.

SUMMARY OF THE INVENTION

The object of the present invention is to provide a master-slave flip-flop in current-switching technology having a first storage element and a second storage element, each of which comprise series-coupled current switches in which the differences of the switching thresholds of the current switches which are directly controlled by a clock required for error-free operation, are generated without the incorporation of special components.

This object is achieved, according to the present invention, by providing a parallel connection of a plurality of transistors or, respectively, of a plurality of transistors functioning as diodes.

BRIEF DESCRIPTION OF THE DRAWINGS

Other objects, features and advantages of the invention, its organization, construction and operation will be best understood from the following detailed description, taken in conjunction with the accompanying drawings, on which.

Those skilled in the art will readily note and appreciate that each of the circuits of FIGS. 1–6 operates as a D flip-flop which basically has a clock input C or C', a data input D and a data output Q.

DESCRIPTION OF THE PREFERRED EMBODIMENTS

Figure 1:
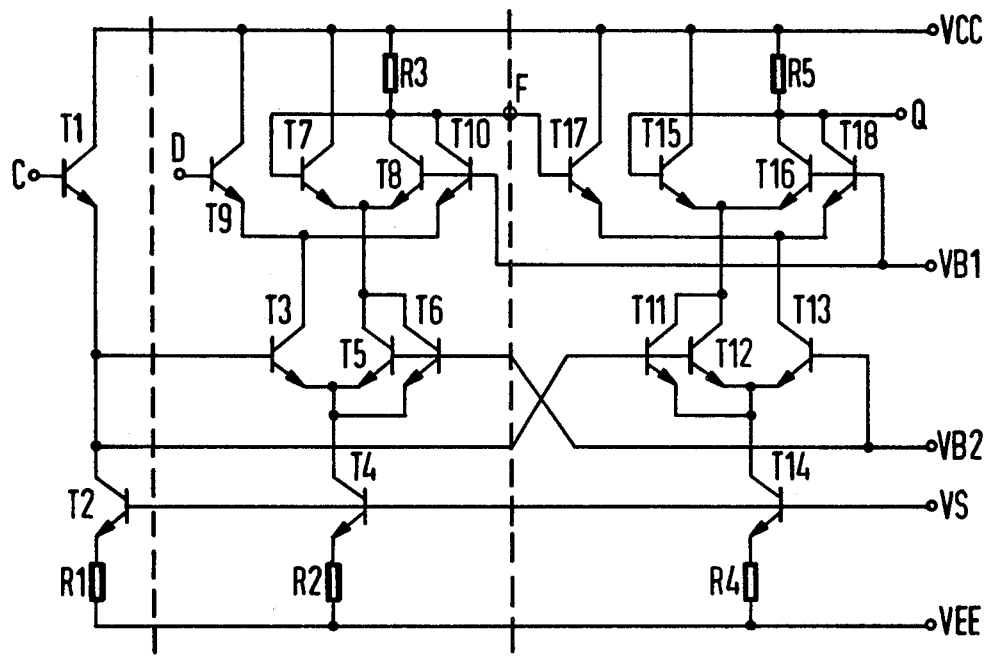
FIG. 1 is a schematic circuit diagram of an embodiment of the invention constructed as a clock-controlled master slave flip-flop having information acceptance by positive clock pulses.

The circuit arrangement of FIG. 1 illustrates a first exemplary embodiment of the invention and is shown as being subdivided into three parts by means of broken lines. The left-hand portion effects a level displacement of the clock pulses pending at the clock input C, with the assistance of a transistor T1 which is connected as an emitter follower. A constant current source serves as a load resistance for the transistor T1 and is formed by a transistor T2 and an emitter resistor R1, also provided in an emitter follower configuration. The base of the transistor T2 is connected to a fixed potential VS whose difference with respect to the negative supply potential VE, together with the value of the emitter resistor R1, determines the magnitude of the current. The auxiliary potential VS is a standard potential, i.e. it is employed for the control of other current source circuits, not only within the illustrated embodiments, but also in conjunction with other logic circuits in a logic module constructed in accordance with large scale integration (LSI) techniques.

The center and right-hand portions of the circuit arrangement of FIG. 1 are the master stage and the slave stage, respectively. Both stages are constructed through the employment of the circuit principles of series coupling, whose typical feature, as is known to those skilled in the art, is the insertion of further current switches comprising emitter-coupled transistors in the collector circuits of the transistors of a first current switch. Since this first current switch has a lower potential with respect to the reference potential VCC than the further current switches, it is designated as the lower current switch. Corresponding to the different potentials of the upper and lower current switches, two different reference potentials VB1 and VB2 are also provided. Again, these reference potentials are to be standard potentials, i.e. they should not differ from corresponding potentials for logic circuits of a completely different type in the integrated logic module.

In order to describe the mode of operation of the flip-flop, let it be arbitrarily assumed that a logic "0" is stored in the master stage, which means that the lower binary signal potential prevails at its output F. Also assume that a logic "1" is pending at the data input D. As long as the signal level of the clock input C is low, the control potential at the base of the transistor T3 also lies lower than the reference potential VB2 because of the level displacement by the transistor T1. Therefore, the transistor T3 is blocked. The current delivered from the current source with the transistor T4 and its emitter resistor R2 flows through the transistors T5 and T6 which are connected in parallel. Accordingly, only the upper current switch with the transistors T7 and T8 receives current, whereas the second upper current switch with the transistors T9 and T10 remains blocked. Since the storage of a logic "0" was assumed, it is readily apparent that the transistor T8 must be conductive in that the collector thereof provides the output potential at the output F. Only in this case does a voltage drop occur at the collector resistor R3, whereby the low signal level is provided at the point F. The same potential is fed back to the base of the transistor T7 so that the switching state of the actual storage circuit of the master stage remains stable. The same, of course, also holds true when, upon a store logic "1", the transistor T7 is conductive instead of the transistor T8.

When a positive clock pulse arrives at the clock input C, the signal level at the base of the transistor T3 is also increased to such a degree that the transistor is rendered conductive and, thereby, the transistors T5 and T6 are blocked. Accordingly, the upper current switch comprising the transistors T7 and T8 becomes blocked, whereas, with the logic "1" pending at the data input, the transistor T9 is rendered conductive. Therefore, the voltage drop at the resistor R3 disappears and essentially the potential VCC is provided at the output F. The feedback of the single level at the point F to the base of the transistor T7 at first remains without influence. It has an effect, however, as soon as the positive clock pulse terminates.

The slave stage is largely identical to the master stage. In particular, series coupling is also employed in the slave stage, whereby the upper current switches with the transistors T15 and T16 or, respectively, T17 and T18, are inserted in the collector circuits of the transistors T11 and T12 or, respectively, T13 of the lower current switch which is fed from a constant current source comprising a transistor T14 and a resistor R4. The resistor R5 serves as a load for the slave stage.

However, a very important difference with respect to the master stage is evident in that the upper current switch with the transistors T15 and T16, which is fed back to itself, is inserted in the collector circuit of the transistors T11 and T12 which are directly controlled by the level-displaced clock pulse. This results in the slave stage, in contrast to the master stage, being blocked for an information acceptance by a positive clock pulse. Such acceptance occurs in the slave stage only when the signal level at the clock input C corresponds to the lower binary value. Information taken over into the master stage during a positive clock pulse is transferred into the slave stage only after the conclusion of the positive clock pulse. The same is then available at the output Q.

In order for a master slave flip-flop to function correctly, it must be provided, as is well known, that the slave stage is already securely blocked when the master stage is activated. Since the lower current switches appertaining to the blocking and activation of the master and slave stages already switch when the clock pulses exceed or fall below a specific limiting value and the edges of the clock pulses have a finite steepness, the necessary differentiation of the switching times can be achieved by providing differing switching thresholds, or by providing a corresponding, mutual displacement of the levels of the clock pulses directly controlling the current switches. According to the present invention, the effect known per se according to which the voltage drop at the base-emitter section of a transistor depends to a small degree on the emitter current density, is exploited to this end. Since, however, transistors having an emitter surface deviating from the internal standard are not provided in an integrated module in order to preserve the universal applicability of the predetermined component supply (exceptions would be true at most for specific input and output circuits in the edge areas of the semi-conductor lamina or chip, cf. Digest of the IEEE International Solid State Circuits Conference, 1974, pp. 62–63), a plurality of transistors are connected in parallel at the appropriate locations of the circuit arrangement. In the exemplary embodiment illustrated in FIG. 1, such is the case at the transistors T5 and T6 or, respectively, T11 and T12. The parallel connection of the transistors T5 and T6, i.e. the halving of the emitter current density, has as a result that the crossover of the current conduction from the transistors T5 and T6 to the transistor T3 only occurs at a higher level of the control pulse than would be the case in a symmetrical design of the current switch because of the predetermined reference potential VB2. In an analogous manner, the response threshold for the lower current switch in the slave stage is reduced by the provision of the parallel connection of the transistors T11 and T12. Since a positive clock pulse blocks the slave stage, it is precisely the desired effect which occurs: the slave stage is already blocked when the master stage is shifted into the condition for receiving a new information pending at the input D and the mater stage is, on the other hand, already blocked for an information acceptance before the slave stage can take over the information last input into the master stage.

Occasionally, the component supply of an integrated module also contains multi-emitter transistors, particularly two-emitter transistors. In this case, the two-emitter transistors can be respectively employed instead of the transistors T5, T6 and the transistors T11, T12. Two-emitter transistors can also then be employed in place of the transistors T8, T10 and T16, T18.

Figure 2:
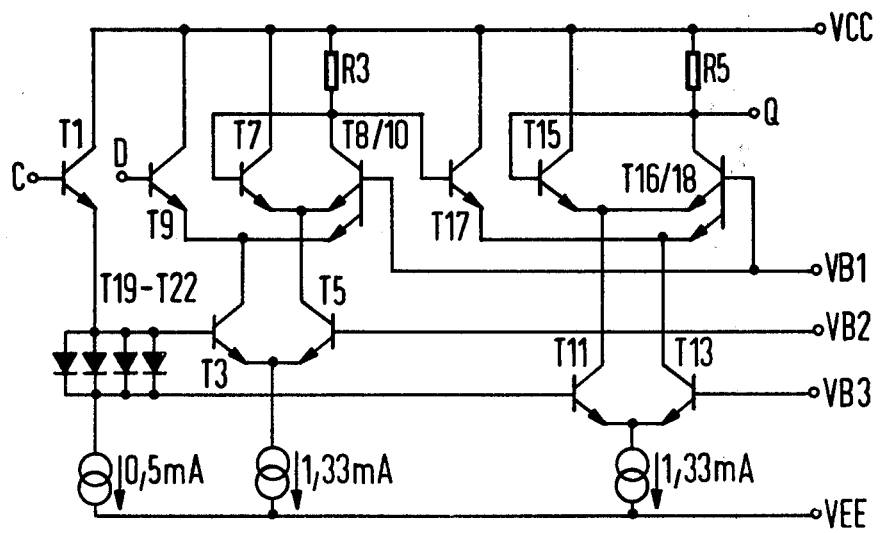
FIG. 2 is a schematic circuit diagram of another embodiment of the invention constructed as a clock-controlled master slave flip-flop having information acceptance by positive clock pulses.

FIG. 2 illustrates a further exemplary embodiment of a master slave flip-flop which accepts information in response to positive clock pulses. The master stage and the slave stage are essentially constructed in the same manner as in the exemplary embodiment of FIG. 1. Therefore, similar components are referenced with the same reference characters. As just mentioned, FIG. 2 employs multi-emitter transistors. Also, the constant current sources of FIG. 1 (T2, R1; T4, R2; T14, R4) have been replaced by constant current symbols.

Deviating from the exemplary embodiment treated above, the differing switching thresholds in the master stage and in the slave stage are not generated by the provision of a corresponding level displacement of the control pulses for the lower current switches of two stages derived from the clock pulses. The level displacement of the control pulses for the lower current switch of the slave stage occurs by means of a parallel connection of four transistors T19–T22, whereby these transistors operate as simple diodes through the connection of the base and collector electrodes of all transistors. The same have therefore been illustrated as diodes. If, in particular, one were to provide only a single transistor of a conventional construction, instead of the transistors T19–T22, than a level displacement of about 0.8 volt would arise which must be compensated by means of different reference potentials for the two current switches in the master stage and the slave stage. Therefore, yet a third reference potential VB3 is introduced, which, moreover, corresponds precisely to the reference potential which is required for any other logic circuits having three-stage series coupling in the integrated module.

By means of the parallel connection of the transistors T19–T22 corresponding to the actual embodiment, the level displacement achieved deviates by about 40 mV from the standard level displacement. This difference effects the displacement of the switching thresholds in the desired manner. Since the level displacement of the control pulses for the lower current switch of the slave stage with respect to the control pulses for the lower current switch of the master stage is somewhat smaller than the difference between the reference potentials VB2 and VB3, the slave stage is already blocked upon an increase of the momentary clock pulse voltage before the master stage is ready for the acceptance of new information.

Figure 3:
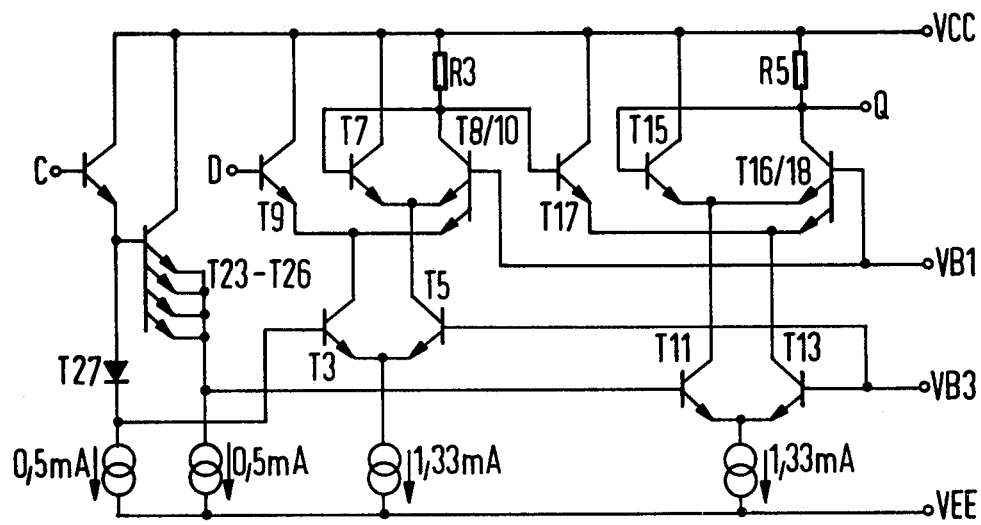
FIG. 3 is a schematic circuit diagram of another embodiment of the invention constructed as a clock-controlled master slave flip-flop having information acceptance by means of positive clock pulses.

A further exemplary embodiment of the invention is illustrated in FIG. 3. Here, the level displacement of a control voltage for the slave stage is compensated essentially by means of the level displacement of the control pulses for the master stage through a transistor T27, shown and operating as a diode, with the help of a plurality of parallel-connected transistors T23–T26 operated as an emitter follower. Therefore, the same reference potential VB3 is employed for the two lower current switches in the master and slave stages. Meanwhile, the level displacements differ by a small amount because of the differing emitter current loads. This differential amount again effects the different switching times.

Figure 4:
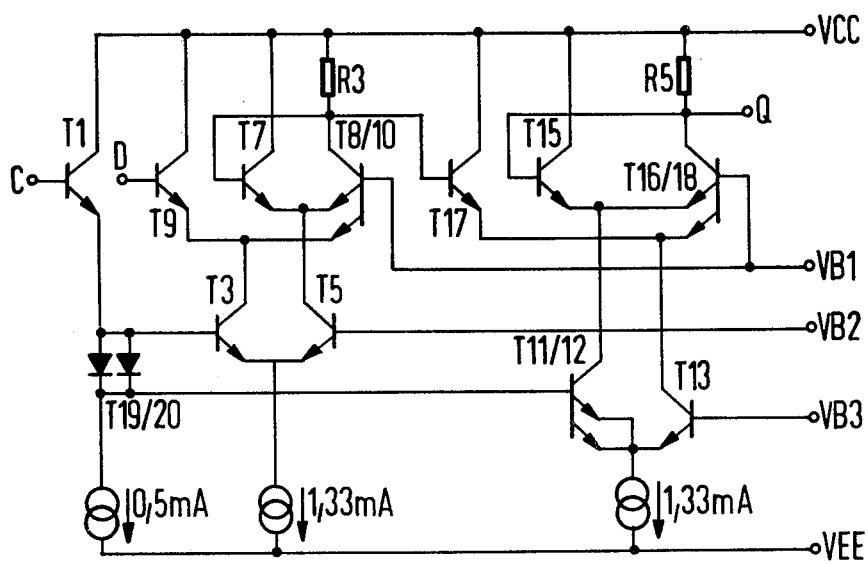
FIG. 4 is a schematic circuit diagram of another embodiment of the invention constructed as a clock-controlled master slave flip-flop having information acceptance by means of positive clock pulses.

FIG. 4 illustrates a master slave flip-flop for positive clock pulses in which a level displacement of the control pulses effective for the lower current switch of the slave stage, by means of the transistors T19 and T20 connected as diodes, is combined with a reduction of the response threshold of this current switch. The manner of operation of this feature is readily apparent from FIG. 4 on the basis of the foregoing explanations, particularly those relating to FIGS. 1 and 2.

Figure 5:
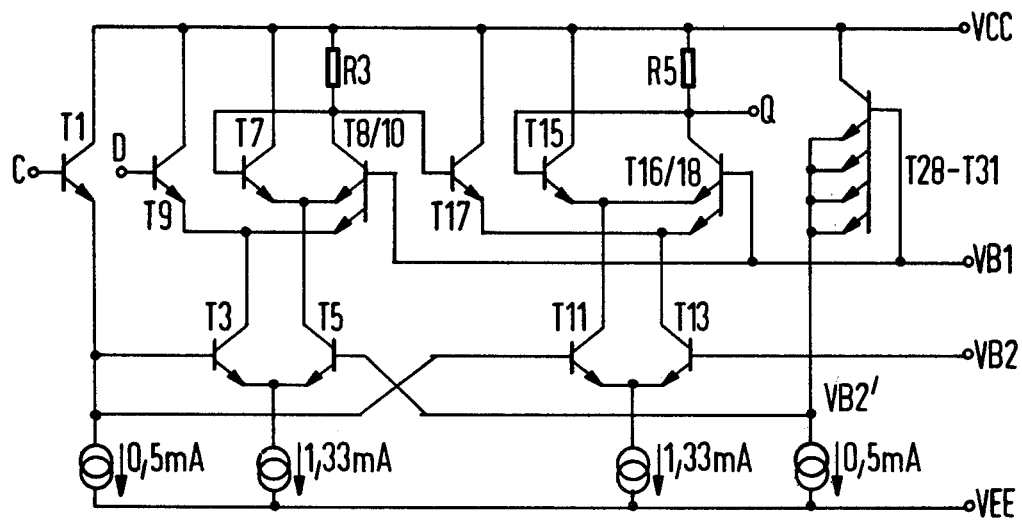
FIG. 5 is a schematic circuit diagram of another embodiment of the invention constructed as a clock-controlled master slave flip-flop having information acceptance by positive clock pulses.

A further possibility for generating the difference of the response thresholds required for the orderly operation of a master slave flip-flop for positive clock pulses is illustrated in FIG. 5. In this case, a reference potential VB2' is derived from the standard reference potential VB1 with the assistance of an emitter follower formed of four transistors T28–T31, connected in parallel, and further connected in series with a constant current source between the potential VCC and the potential VEE. The reference potential VB2' is slightly higher than the internal standard potential VB2. The internal standard potential VB2 is utilized for the lower current switch of the slave stage, while the additionally generated reference potential VB2' is provided to the lower current switch of the master stage. Both lower current switches are controlled by the same control pulses derived from the clock pulses. By means of the reference potential VB2' which is greater than the standard reference potential VB2, the switching threshold for the lower current switch of the master stage is also increased.

The possible variations for the displacement of the switching thresholds by means of differing emitter current densities are not yet exhausted in the exemplary embodiments discussed thus far. Therefore, for example, in a flip-flop similar to that illustrated in FIG. 1, the lower current switch exhibits four transistors on the one side connected in parallel. Likewise, greater displacements of the switching thresholds can be achieved by means of the parallel connection of more transistors than specified herein.

Figure 6:
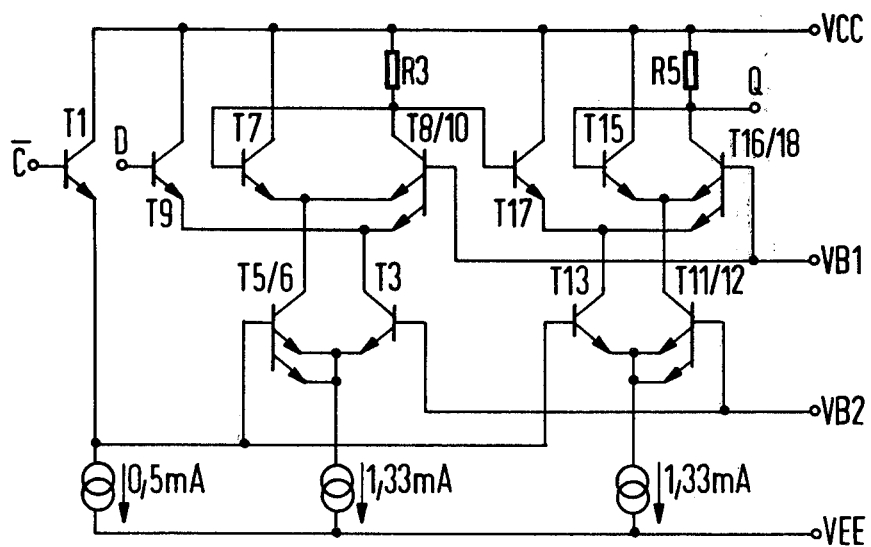
FIG. 6 is a schematic circuit diagram of another embodiment of the invention constructed as a clock-controlled master slave flip-flop having information acceptance by negative clock pulses.

All measures described above in conjunction with master slave flip-flops for positive clock pulses and all measures that can be derived therefrom can also be transferred to master slave flip-flops for negative clock pulses. An exemplary embodiment of such a construction is illustrated in FIG. 6 which, for the remainder fully corresponds to the embodiment illustrated in FIG. 1. Corresponding to the presupposition that, now, the higher signal level is applied at the clock input C, in the pulse pauses and the acceptance of an information pending at the input D occurs at the lower signal level, the insertion of the upper current switches in the collector circuits of the transistors of the lower current switches and the direction of the displacement of the switching thresholds are interchanged.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a clock-controlled storage arrangement of the type containing master and slave flip-flop storage elements each comprising, in upper and lower levels, series-coupled current switches, each having emitter-coupled transistors, and in which, in each storage element, a lower level clock-controlled current switch includes a transistor comprising a collector circuit, said collector circuit connected to an upper level current switch having a data input, the improvement therein comprising displacement means for displacing the switching thresholds of the storage elements including parallel-connected transistors in at least one of the lower current switches of the master and slave flip-flop storage elements, said displacement means comprising shift means connected to each of the lower current switches for providing shift-displaced control pulses including a plurality of parallel-connected transistors having common base, collector and emitter terminals and a diode-operating device connected in parallel with said common base and said common emitter terminals.

2. In the improved storage arrangement of claim 1, wherein said displacement means is further defined as comprising:

response means for displacing the response threshold of the master flip-flop storage element.

3. In the improved storage arrangement of claim 1, wherein said displacement means is further defined as comprising:

response means for displacing the response threshold of the slave flip-flop storage element.

4. In the improved storage arrangement of claim 1, wherein said displacement means is further defined as comprising:

response means for displacing the response threshold of the master and slave flip-flop storage elements.

5. The improved storage arrangement of claim 1, wherein said displacement means is further defined as comprising:

level displacement means for displacing the clock pulse level of the master flip-flop storage element.

6. The improved storage arrangement of claim 1, wherein said displacement means is further defined as comprising:

level displacement means for displacing the clock pulse level of the slave flip-flop storage element.

7. The improved storage arrangement of claim 1, wherein said displacement means is further defined as comprising:

level displacement means for displacing the clock pulse level of the master and slave flip-flop storage elements.

8. The improved storage arrangement of claim 1, wherein the upper and lower current switches of each flip-flop storage element have first and second current paths, and wherein said displacement means is further defined as comprising:

parallel-connected transistors in said first current path in one of the flip-flop storage elements and parallel connected transistors in said second current path in the other of the flip-flop storage elements.

9. The improved circuit arrangement of claim 1, comprising:

means connected to said lower current switches for deriving control pulses from the clock pulses including a plurality of diode-operating devices having a first terminal connected to one of the lower current switches and a second terminal connected to the other lower current switch to provide shift displaced control pulses, the lower current switches being connected to respective reference potentials.

10. The improved circuit arrangement of claim 1, comprising:

means connected to and providing a first reference potential to one of the lower current switches including a constant current source, and a plurality of parallel connected transistors having a common base terminal connected to a first predetermined potential and a common emitter terminal connected to said constant current source and the lower current switch.

11. The improved circuit arrangement of claim 1, wherein said displacement means if further defined as comprising:

means including parallel-connected transistors, connected to the lower current switch of one of the storage elements and operable to displace the switching threshold thereof; and means including parallel-connected diode-operating devices, connected to the lower current switch of the other storage element and operable to displace the level of the control pulses.

12. A clock-controlled data storage arrangement comprising:

a plurality of constant current sources;

a plurality of resistors;

a master flip-flop including a master data input for receiving input data, a clock input for receiving clock pulses and a master data output;

a slave flip-flop including a slave data input connected to said master data output, a clock input connected in common with said clock input of said master flip-flop and a slave data output, said master and slave flip-flops each comprising first, second, third, fourth and fifth transistors each having a base, an emitter and a collector, and six and seventh transistors each having a base, an emitter, a collector and an additional electrode, and a constant current source, in said master flip-flop, said base of said first transistor connected to said master data input, said emitter connected to said emitter of said sixth transistor and said collector connected to a first potential, said collector of said sixth transistor connected to said master data output and to said base of said second transistor, said base of said sixth transistor connected to a second potential and said additional electrode connected to said base of said third transistor, said base of said second transistor and said collector of said third transistor together connected to the first potential via one of said resistors, and said emitters of said second and third transistors connected to said collectors of said fourth and seventh transistors, said emitters of said first and sixth transistors connected to said collector of said fifth transistor, and said emitters of said fourth, fifth and seventh transistors connected to a respective constant current source, said base of said fifth transistor connected to said clock input, and said additional electrode of said seventh transistor connected to said base of said fourth transistor and said base connected to a third potential, and in said slave flip-flop, said base of said first transistor connected to said slave data input, said emitter connected to said emitter of said sixth transistor and said collector connected to a first potential, said collector of said sixth transistor connected to said slave data output and to said base of said second transistor, said base of said sixth transistor connected to a second potential and said additional electrode connected to said base of said third transistor, said base of said second transistor and said collector of said third transistor connected to the first potential via another of said resistors, and said emitters of said second and third transistors connected to said collectors of said fourth and seventh transistors, said emitters of said first and sixth transistors connected to said collector of said fifth transistor, and said emitters of said fourth, fifth and seventh transistors connected to a respective constant current source, said base of said fifth transistor connected to said third potential, said additional electrode of said seventh transistor connected to said base of said fourth transistor and said base of said seventh transistor connected to said clock input, whereby the parallel connection of transistors provides a displacement of the switching thresholds.

13. A clock-controlled data storage arrangement comprising:
a plurality of constant current sources;
a plurality of resistors;
a master flip-flop and a slave flip-flop including a master data input, a master data output, a slave data input connected to said master data output, a slave data output, a master clock input and a slave clock input,
each of said flip-flops comprising first, second, third, fourth, fifth and sixth transistors each including a base, a collector and an emitter with said bases of said second and third transistors being common thereto and said collectors of said second and third transistors being common thereto,
said base of said first transistor connected to the respective data input, said collector of said first transistor connected to a first potential and said emitter of said first transistor connected to said emitter of said second transistor and to said collector of said fifth transistor, said common collector of said second and third transistors connected to said base of said fourth transistor, to the respective data output and via one of said resistors to the first potential, said base of said second transistor connected to a second potential, said collector of said fourth transistor connected to the first potential and said emitters of said third and fourth transistors connected to said collector of said sixth transistor, said emitters of said fifth and sixth transistors connected to a third potential via a respective one of said constant current sources, said base of said sixth transistor of said master flip-flop connected to a fourth potential and said base of said fifth transistor of said master flip-flop constituting said master clock input, said base of said fifth transistor of said slave flip-flop connected to a fifth potential an said base of said sixth transistor of said slave flip-flop constituting said slave clock input; and clock means including a clock input for receiving clock pulses, a master clock output connected to said master clock input and a slave clock output connected to said slave clock input, said clock means including means connected between said clock input and said master an slave clock outputs and responsive to an input clock pulse to provide master clock pulses of a first magnitude and slave clock pulses of a second magnitude.

14. The clock-controlled data storage arrangement of claim 13, wherein said clock means is further defined as comprising:
a clock input transistor including a base for receiving clock pulses, and a collector-emitter circuit connected in series with one of said constant current sources between the first and third potentials; and
a plurality of parallel-connected semiconductor elements connected in series between said transistor and said constant current source and including said master and slave clock outputs.

15. The clock-controlled data storage arrangement of claim 14, wherein said plurality of semiconductor elements comprises:
a plurality of parallel-connected semiconductor devices connected to operate as diodes, the commonly-connected terminals of said diodes constituting said master and slave clock outputs.

16. The clock-controlled data storage arrangement of claim 14, wherein said plurality of semiconductor elements comprises:
a plurality of parallel-connected transistors connected to operate as diodes.

17. The clock-controlled data storage arrangement of claim 14, wherein said plurality of semiconductor elements comprises:
a plurality of transistors having a common base terminal connected to said collector-emitter circuit, a common collector terminal connected to the first potential and a common emitter terminal connected as and constituting said slave clock output; and
a diode-operating element serially connected between said collector-emitter circuit and said one constant current source and connected to provide said master clock output.

18. The clock-controlled data storage arrangement of claim 13, wherein:

in said slave flip-flop, said sixth transistor has a seventh transistor connected thereto, said seventh transistor including a base in common with said base of said sixth transistor, a collector in common with said collector of said sixth transistor, and an emitter in common with said emitter of said sixth transistor.

19. A clock-controlled data storage arrangement comprising:
- a plurality of constant current sources;
- a plurality of resistors;
- a master flip-flop and a slave flip-flop including a master data input, a master data output, a slave data input connected to said master data output, a slave data output, a master clock input, and a slave clock input connected to said master clock input,
- each of said flip-flops comprising first, second, third, fourth, fifth and sixth transistors each including a base, a collector and an emitter with said bases of said second and third transistors being common thereto and said collectors of said second and third transistors being common thereto,
- said base of said first transistor connected to the respective data input, said collector of said first transistor connected to a first potential and said emitter of said first transistor connected to said emitter of said second transistor and to said collector of said fifth transistor,
- said collector of said second transistor connected to said base of said fourth transistor, to the respective data output and to the first potential, and said base of said second transistor connected to a second potential,
- said collector of said fourth transistor and said common collectors of said second and third transistors connected to the first potential via one of said resistors, and said emitters of said third and fourth transistors connected to said collector of said sixth transistor,
- said emitters of said fifth and sixth transistors connected to a third potential via a respective on of said constant current sources,
- said base of said fifth transistor of said master flip-flop and said base of said sixth transistor of said slave flip-flop connected as said master and slave clock inputs,
- said base of said fifth transistor of said slave flip-flop connected to a fourth potential, and
- said base of said sixth transistor of said master flip-flop connected to a fifth potential; and
- means for deriving the fifth potential from the first, second and third potentials comprising a plurality of parallel-connected transistors having a common base terminal connected to the second potential, a common collector terminal connected to the first potential and a common emitter terminal connected via one of said constant current sources to the third potential.

20. A clock-controlled data storage arrangement comprising:
- a plurality of constant current sources;
- a plurality of resistors;
- a master flip-flop and a slave flip-flop including a master data input, a master data output, a slave data input connected to said master data output, a slave data output, a master clock input and a slave clock input connected to said master clock input forming a common clock input,
- each of said flip-flops comprising first, second, third, fourth, fifth, sixth and seventh transistors each including a base, a collector and an emitter with the bases of said second and third transistors being common thereto, said collectors of said second and third transistors being common thereto and connected to a first potential via a respective resistor in each flip-flop, said base of said sixth and seventh transistors in common thereto in said slave flip-flop, said bases of said fifth and seventh transistors common thereto in said master flip-flop, said collectors of said sixth and seventh transistors common thereto in said slave flip-flop, said collectors of said sixth and seventh transistors common thereto in said master flip-flop, and said emitters of said fifth, sixth an seventh transistors connected in common in both flip-flops,
- said base of said first transistor connected to the respective data input, said collector of said first transistor connected to the first potential and said emitter of said first transistor connected to said emitter of said second transistor and to said collector of said fifth transistor in said slave flip-flop, and said collector of said first transistor connected to the first potential and said emitter of said first transistor connected to said emitter of said second transistor and to said collector of said sixth transistor in said master flip-flop,
- said collector of said second and third transistors connected to said base of said fourth transistor, to the respective data output and to the first potential, and said base of said second transistor connected to a second potential in both flip-flops,
- said collector of said fourth transistor connected to the first potential and said emitters of said third and fourth transistors connected to said collector of said sixth transistor in said slave flip-flop, and said emitters of said third and fourth transistors connected to said collector of said fifth transistor in said master flip-flop,
- said emitters of said fifth, sixth and seventh transistors connected to a third potential via a respective one of said constant current sources in both flip-flops, and
- said base of said sixth transistor of each of said master and slave flip-flops connected to a fourth potential, and said base of said fifth transistor in both said master and slave flip-flops connected to said common clock input.

* * * * *